United States Patent
Papandreou et al.

(10) Patent No.: US 9,558,817 B2
(45) Date of Patent: Jan. 31, 2017

(54) CONDITIONING PHASE CHANGE MEMORY CELLS

(71) Applicant: International Business Machines Corporation, Armonk, NY (US)

(72) Inventors: Nikolaos Papandreou, Thalwil (CH); Charalampos Pozidis, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/659,038

(22) Filed: Oct. 24, 2012

(65) Prior Publication Data
US 2013/0107619 A1 May 2, 2013

(30) Foreign Application Priority Data

Oct. 28, 2011 (EP) .................................... 11187118

(51) Int. Cl.
| G11C 11/34 | (2006.01) |
| G11C 13/00 | (2006.01) |
| G11C 7/20  | (2006.01) |

(52) U.S. Cl.
CPC ............ *G11C 13/0004* (2013.01); *G11C 7/20* (2013.01); *G11C 13/0069* (2013.01); *G11C 2013/0083* (2013.01)

(58) Field of Classification Search
CPC ............ G11C 13/0004; G11C 13/0069; G11C 13/0097; G11C 11/5678; G11C 2013/0083; G11C 11/5614; G11C 11/5685; G11C 2013/0092
USPC ............................ 365/148, 158, 163, 189.16
See application file for complete search history.

(56) References Cited

U.S. PATENT DOCUMENTS

| 6,181,610 B1* | 1/2001 | Shiga ................. 365/189.05 |
| 7,646,625 B2* | 1/2010 | Philipp et al. ............ 365/148 |
| 7,679,950 B2* | 3/2010 | Philipp et al. ............ 365/163 |
| 7,916,524 B2* | 3/2011 | Happ et al. ............... 365/163 |
| 2009/0003035 A1 | 1/2009 | Philipp et al. |
| 2009/0003044 A1 | 1/2009 | Happ et al. |
| 2013/0215669 A1* | 8/2013 | Haukness ............... 365/148 |

FOREIGN PATENT DOCUMENTS

| CN | 101770807 A | 7/2010 |
| CN | 1664953 B | 9/2011 |
| CN | 103890851 A | 6/2014 |
| JP | 20074873 A | 1/2007 |
| WO | 2011103379 A2 | 8/2011 |

(Continued)

OTHER PUBLICATIONS

Lee et al., "Architecting Phase Change Memory as a Scalable DRAM Alternative", ISCA' 09, Jun. 20-24, 2009, Austin, TX USA, pp. 1-12.*

(Continued)

*Primary Examiner* — Andrew Q Tran
(74) *Attorney, Agent, or Firm* — Vazken A. Alexanian; John W. Hayes; William H. Hartwell

(57) ABSTRACT

A method for conditioning at least one Phase Change Memory, PCM, cell. The PCM cell is characterized by a number of pre-defined characteristics or properties. For pre-conditioning, at least one conditioning pulse is applied to the PCM such that at least one selected characteristic of the number of pre-defined characteristics is changed to a desired value.

13 Claims, 11 Drawing Sheets

(56) References Cited

FOREIGN PATENT DOCUMENTS

WO 2013061191 A1 5/2013

OTHER PUBLICATIONS

PCT/IB2012/055466, International Search Report Written Opinion, Dec. 19, 2012.
PCT/IB2012/055466, International Search Report, Dec. 19, 2012.
Chimenton, A. et al.,"Set of electrical characteristics parameters suitable for reliability analysis of multimegabit phase change memory arrays", NVSMW 2008, pp. 49-51.
Della Marca, V. et al., "SET switching effects on PCM endurance", ESSDERC 2010, pp. 321-324.
Sarkar J. and Gleixner, B., "Evolution of phase change memory characteristics with operating cycles: Electrical characterization and physical modeling", Apl. Phys. Lett., 91, 233506 (2007).
Zambelli, C. et. al.,"Empirical investigation of SET seasoning effects in phase change memory arrays", Solid State Electronics, vol. 58, Iss. 1, pp. 23-27, Apr. 2011.

\* cited by examiner

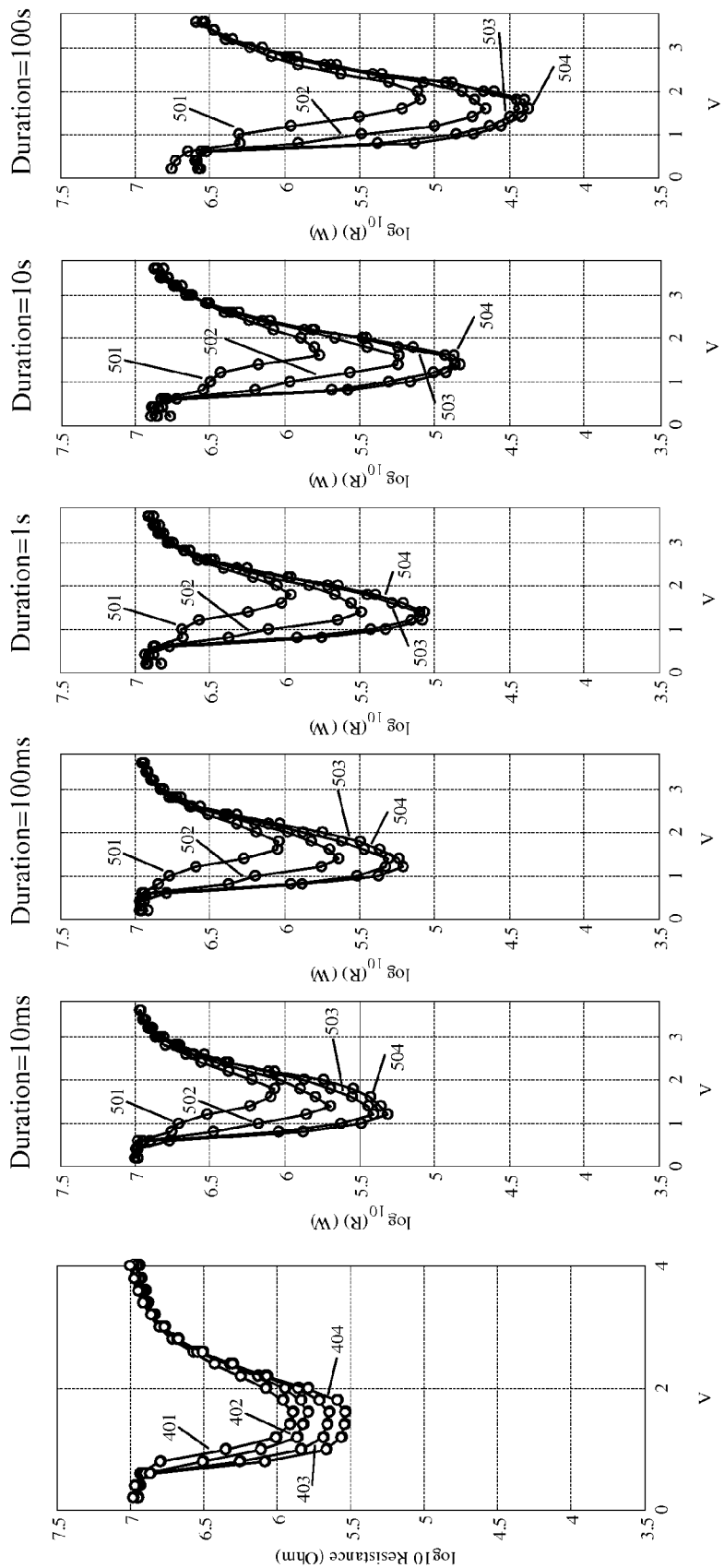

CONDITIONING PHASE CHANGE MEMORY CELLS

CROSS-REFERENCE TO RELATED APPLICATION

This application claims priority under 35 U.S.C. §119 from European Patent Application No. 11187118.2 filed Oct. 28, 2011, the entire contents of which are incorporated herein by reference.

BACKGROUND OF THE INVENTION

Field of the Invention

The invention relates to a method and to a device for conditioning at least one Phase Change Memory, PCM, cell having a number of pre-defined characteristics.

Description of Related Art

Phase change memory (PCM) is a non-volatile solid-state memory technology that exploits the reversible, thermally-assisted switching of specific chalcogenides between certain states of different electrical conductivity.

PCM is a promising and advanced emerging non-volatile memory technology mainly due to its excellent features including low latency, high endurance, long retention and high scalability. PCM can be considered a prime candidate for Flash replacement, embedded/hybrid memory and storage-class memory. Key requirements for competitiveness of PCM technology can be multi-level cell functionality, in particular for low cost per bit, and high-speed read/write operations, in particular for high bandwidth. Multilevel functionality, i.e. multiple bits per PCM cell, can be a way to increase capacity and thereby to reduce cost.

Multi-level PCM is based on storing multiple resistance levels between a lowest (SET) and a highest (RESET) resistance value. Multiple resistance levels or levels correspond to partial-amorphous and partial-crystalline phase distributions of the PCM cell. Phase transformation, i.e. memory programming, can be enabled by Joule heating. In this regard, Joule heating can be controlled by a programming current or voltage pulse. Storing multiple resistance levels in a PCM cell is a challenging task.

For example, FIG. 1 shows a diagram illustrating a RESET pulse and a SET pulse for programming a PCM cell. The x-axis of diagram of FIG. 1 shows the time t and the y-axis shows the temperature T and the current I. The RESET pulse is shorter than the SET pulse, but has a higher current amplitude. Further, the RESET pulse exceeds the melting temperature T_melt. In contrast, the SET pulse lies between the melting temperature T_melt and the glass temperature T_glass.

An ideal non-volatile memory technology possesses a number of characteristics or features that enable it to be used in many different applications and across vastly different workloads. Such features include a high programming speed, low programming power, low cost per bit, reliability, in terms of stability of the stored information with time and/or temperature, high cycling endurance and large noise margins for low error rates. Endurance effects on the cell programming characteristics are commonly known in the art.

Regarding the high programming speed, fast read and writes are crucial in high-performance main memory applications which are conventionally served by DRAM mainly. Regarding the low programming power, the approach is to minimize the energy per bit stored. This can be crucial for embedded applications and for scaling to future technology nodes. Regarding low cost per bit, this can at least partially be achieved by multi-level cell (MLC) storage.

Conventional non-volatile memory technologies posses only a subset of the above features, which makes them unsuitable for universal memory. In particular, flash suffers from very long write/erase latencies and low endurance, which can preclude its usage as main memory or even as hybrid memory, e.g. with DRAM as cache, or serving as cache to DRAM. PCM, in turn, exhibits relatively high energy per bit for writing and can have reliability problems, mainly because of short-term resistance drift.

Resistive RAM, in particular ionic-based, on the other hand, can suffer from low reliability, both in terms of endurance and cell-state retention.

Typically, improvements in one or more of the above desirable features can be achieved at the cost of deterioration in another desirable feature. A conventional trade-off is the increase of the resistance margin (R-margin) between the low-resistance state (SET) and the high-resistance state (RESET) which enables MLC storage at the expense of higher programming power, which typically is detrimental for cell endurance.

Accordingly, it is an aspect of the present invention to tailor the characteristics of a PCM cell.

SUMMARY OF THE INVENTION

According to a first aspect of the invention, a method for conditioning at least one Phase Change Memory (PCM) cell having a number of pre-defined characteristics is provided. The method includes applying at least one conditioning pulse to the PCM cell such that at least one selected characteristic of the number of pre-defined characteristics is changed to a desired value.

According to a second aspect of the invention, a device for conditioning at least one PCM, cell having a number of predefined characteristics is procided. The device includes a pre-conditioner for applying at least one conditioning pulse to the PCM cell such that at least one selected characteristic of the number of predefined characteristics is changed to a desired value.

BRIEF DESCRIPTION OF THE DRAWINGS

FIGS. 3 to 8 show examples of R-V curves of a PCM cell for different pulse widths;

Similar or functionally similar elements in the figures have been allocated the same reference signs if not otherwise indicated.

DETAILED DESCRIPTION OF THE PREFERRED EMBODIMENTS

Figure 1:
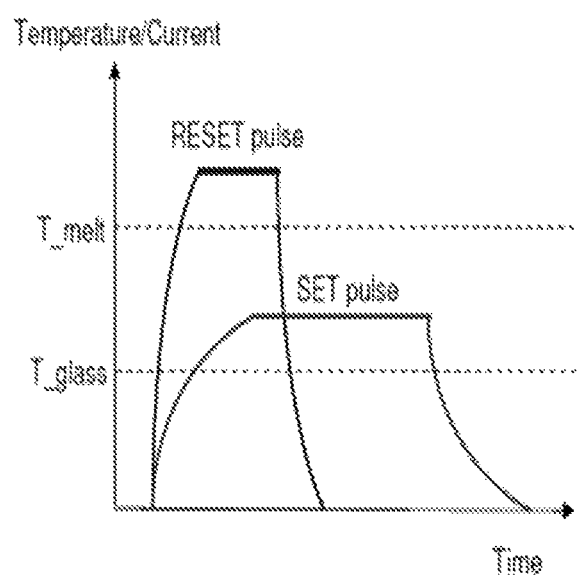
FIG. 1 shows a diagram illustrating a RESET pulse and a SET pulse for programming a PCM cell.

According to an embodiment of a first aspect, a method for conditioning at least one Phase Change Memory, PCM, cell is suggested. The PCM cell is characterized by a number of pre-defined characteristics, properties, features or attributes. For conditioning or pre-conditioning, at least one conditioning pulse is applied to the PCM cell such that at least one selected characteristic of the number of pre-defined characteristics is changed to a desired value.

According to some implementations, the characteristics of the PCM cell, in particular the programming characteristics of the PCM cell, can be tailored to suit different or even multiple applications. In particular, a simultaneous enhancement of the performance of the PCM cell can be provided as well as a reduction of the programming power and enhancement of the MLC capability. Thus, a universal memory can be provided which can be adjusted or tailored according to a selected application.

According to some implementations, several favourable trade-offs between desirable characteristics or attributes can be achieved according to a targeted or selected application, in particular by varying the parameters of the conditioning pulse. The PCM cell can approach DRAM-like behaviour, including fast read/write and high reliability. By applying a different conditioning pulse, the PCM cell can approach storage-like behaviour, in particular low cost per bit due to higher MLC capacity. This can be reached because the effect on the cell characteristics can be dependent on the energy of the applied conditioning pulse.

According to some implementations, a rapid broadening of the programming (resistance versus voltage, or R-V) curve and a reduction of the SET resistance (R-SET) of the PCM cell can be provided with cell cycling. In particular, a short-duration DC-conditioning pulse at an appropriate current can emulate this effect. The cell endurance of the pre-conditioned PCM cell cannot be compromised.

As mentioned above, several favourable trade-offs can be possible, in particular regarding tailored or universal memory characteristics. For example, a higher R-margin for given programming latency and power can be provided. A higher R-margin, in turn, can enable a trade-off between storage of more levels or higher noise margin and better drift tolerance.

According to another example, a short program latency can be provided for a fixed R-margin and a fixed programming power. Here, high-performance memory applications can be possible.

According to another example, a lower programming power can be provided for a fixed R-margin and a fixed program latency. Thus, low-energy per bit and high endurance can be provided which enables the PCM cell to be used for technology scaling.

According to another example, the R-window can shift downwards at the same R-margin and programming power. This can be desirable for fast-sensing memory applications. Further, a lower drift and a lower resistance can be provided.

According to some implementations, various desirable combinations of characteristics or attributes can be possible, in particular regarding tailoring memory characteristics to many different applications, or stepping towards storage-class memory which can play a broad role in the memory-storage hierarchy.

In an embodiment, the method includes selecting at least one characteristic which is to be changed from the number of pre-defined characteristics, selecting at least one conditioning pulse for changing the selected characteristic to a desired value or in a defined manner, and applying at least one conditioning pulse to the PCM cell such that the selected characteristic is changed to the desired value or the defined manner.

The conditioning pulse can be selected in dependence on the selected characteristic which is to be changed and in particular in dependence on the desired value of the selected characteristic.

In a further embodiment, the method includes selecting a certain behaviour from a set of pre-determined behaviours for the PCM cell, selecting at least one conditioning pulse in dependence on the selected certain behaviour, and applying at least one conditioning pulse to the PCM cell such that the PCM cell attains the selected certain behaviour. Here, the conditioning pulse is selected or generated in dependence on the selected certain behaviour for the PCM cell.

In a further embodiment, the method includes selecting a certain behaviour from a set of pre-determined behaviours for the PCM cell, selecting at least one characteristic which is to be changed from the number of pre-defined characteristics in dependence on the selected certain behaviour, selecting at least one conditioning pulse for changing the selected at least one characteristic to the desired value, and applying at least one conditioning pulse to the PCM cell such that the selected at least one characteristic is changed to the desired value.

In a further embodiment, the number of pre-defined characteristics includes a certain resistance margin between a lowest (SET) and a highest (RESET) resistance value of the PCM cell, a certain programming speed being defined as a duration of the programming pulse necessary to bring the PCM cell to a definite low-resistance state, and a certain programming power being defined as the power of the programming pulse necessary to bring the cell to a definite high-resistance state.

As mentioned above, the conditioning of the PCM cells is achieved by biasing the PCM cell with a specific current or voltage pulse for certain duration. The amplitude, the duration and the shape of the conditioning pulse can be adjusted depending on the targeted characteristics of the memory after conditioning.

In a further embodiment, the method includes selecting two of the pre-defined characteristics and fixing them, and changing the non-fixed third pre-defined characteristic by the at least one conditioning pulse. Here, two characteristics are fixed, for example the resistance margin and the programming speed, and the third characteristic, here for example the programming power, is changed in the selected certain manner.

In a further embodiment, the method includes selecting one of the pre-defined characteristics and fixing it, and changing the other two pre-defined characteristics to desired values by the at least one conditioning pulse. Here, one characteristic is fixed, for example the resistance margin, and the other two characteristics, here for example the programming power and the programming speed, are changed in the selected certain manner.

In a further embodiment, the conditioning pulse has a duration which is at least $10^4$ times, in particular $10^5$ times, longer than a RESET programming pulse for programming the PCM cell to have a highest (RESET) resistance value, wherein the RESET programming pulse has a duration that is less than 100 ns.

In a further embodiment, the conditioning pulse is embodied by a single long pulse or by a sequence of short pulses, wherein each of the short pulses can be a box pulse, i.e., a rectangular pulse with very short leading and trailing edges. In particular, a short pulse has duration similar to a RESET pulse. For example, a long pulse has a duration equal to at least $10^4$ times of the duration of a RESET pulse.

In a further embodiment, the conditioning pulse is applied once to the PCM cell before the PCM cell is used in a certain application of a plurality of applications for the PCM cell. Thus, the PCM cell is pre-conditioned after it is manufactured and before it is used in a certain application.

In particular, the PCM cell is controllable by a first terminal connected to a bitline and by a second terminal connected to a wordline. The conditioning pulse can be a pulse applied to the wordline and, thus, to the second terminal. Alternatively, the conditioning pulse can be a pulse applied to the bitline and the first terminal. Alternatively, the PCM cell can be controllable by a single terminal, as is typical in diode selector devices. In this case, the conditioning pulse is a pulse applied to this single terminal.

In a further embodiment, at least one of duration, amplitude and shape of the conditioning pulse is adapted in dependence on a selected application of a plurality of applications for the PCM cell.

For example, the conditioning pulse can be a DC pulse of a defined shape, e.g. rectangular, triangular or trapezoidal.

In a further embodiment, the method includes selecting a subset of an array of PCM cells, and applying at least one conditioning pulse to the PCM cells of the selected subset such that at least one selected characteristic of the number of predefined characteristics is changed.

In a further embodiment, the method includes identifying those PCM cells in the array for which the pre-defined characteristics do not have the desired values, and applying at least one conditioning pulse to the identified PCM cells such that the characteristics of the identified PCM cells obtain the desired values.

Any embodiment of the first aspect can be combined with any embodiment of the first aspect to obtain another embodiment of the first aspect.

According to an embodiment of a second aspect, the invention relates to a computer program comprising a program code for executing the method for the first aspect for conditioning at least one PCM cell when run on at least one computer.

According to an embodiment of a third aspect, a device for conditioning at least one Phase Change Memory, PCM, cell is suggested. The PCM cell is characterized by a number of pre-defined characteristics or properties. The device includes a pre-conditioner which is configured to apply at least one conditioning pulse to the PCM cell such that at least one selected characteristic of the number of predefined characteristics is changed to a desired value.

The pre-conditioner can be also called biaser. The pre-conditioner or biaser can be any biasing means.

The respective means, in particular the pre-conditioner or biaser, can be implemented in hardware or in software. If said means are implemented in hardware, it can be embodied as a device, e.g. as a computer or as a processor or as a part of a system, e.g. a computer system. If said means are implemented in software it can be embodied as a computer program product, as a function, as a routine, as a program code or as an executable object.

Figure 2:
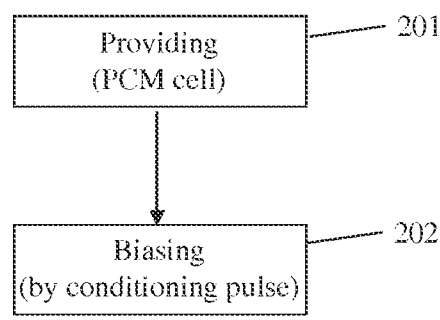
FIG. 2 shows a first embodiment of a sequence of method steps for conditioning a PCM cell.

In FIG. 2, a first embodiment of a sequence of method steps for conditioning a PCM cell is depicted. In step 201, a PCM cell is provided which has a number of pre-defined characteristics, e.g. a certain R-margin, a certain programming speed and a certain programming power for programming the PCM cell. In particular, the PCM cell is provided as a part of an array of PCM cells. In particular, the PCM cell is a multi-level PCM cell which is configured to store multiple resistance levels between a lowest (SET) and a highest (RESET) resistance value.

The respective PCM cell is controllable by a first terminal connected to a bitline and by a second terminal connected to a wordline. Alternatively, a selection device with one terminal controlling the PCM cell can be employed, as in the case of a diode.

In step 202, at least one conditioning pulse is applied to the PCM cell such that at least one selected characteristic of the number of pre-defined characteristics is changed to a desired value.

In particular, said step 202 can include selecting at least one characteristic which is to be changed from the number of pre-defined characteristics, selecting at least one conditioning pulse for changing the selected characteristic in a defined manner, and biasing the PCM cell by the selected at least one conditioning pulse such that the selected characteristic is changed in the defined manner. For example, the conditioning pulse has a duration which is at least $10^4$ times longer than a programming pulse for programming the PCM cell to have the RESET resistance value.

Particularly, the conditioning pulse is applied once to the PCM cell before the PCM cell is used in a certain application of a plurality of applications for the PCM cell. Thus, the universal PCM cell is adapted for a certain application by means of the selected conditioning pulse. Said conditioning pulse can be a wordline (or bitline) pulse applied to the wordline (or the bitline) and therefore to the second (or first) terminal. Step 202 can include selecting a subset of the array of PCM cells, and biasing the PCM cells of the selected subset by the at least one conditioning pulse such that at least one selected characteristic of the number of pre-defined characteristics is changed in a particular manner. The subset of PCM cells can be adapted in an equal way for an equal application of use.

The cell characteristics of a typical cell can be not ideal for multi-level storage, because of the small RESET/SET contrast and the high SET resistance. Thus, there is a need to increase the RESET/SET contrast and to achieve a lower SET resistance. This can be achieved, for example, by the method for FIG. 2, wherein the effects of DC-pulses on the R-V curve with an $I_{DC}$ of 160 μA is shown in the example of FIGS. 3 to 8.

In this regard, FIG. 3 shows a number of average R-V curves of a collection of PCM cells before DC conditioning. In FIG. 3, curves 401, 402, 403 and 404 are generated by voltage pulses with a pulse width of 100 ns, 200 ns, 500 ns, and 1000 ns, respectively and by varying the amplitude of the voltage pulse from 0.2 Volts to 4.0 Volts.

FIG. 4 shows the average R-V curves of the same cells after conditioning by a DC current pulse of duration equal to 10 ms and amplitude of 160 uA. Similarly, FIGS. 5, 6, 7 and 8 show the average R-V curves of the same cells after conditioning by a DC current pulse of amplitude equal to 160 uA and duration equal to 100 ms, 1 s, 10 s and 100 s, respectively.

In FIGS. 4 to 8, curves 501, 502, 503 and 504 of FIGS. 4-8 are generated by voltage pulses with a pulse width of 100 ns, 200 ns, 500 ns, and 1000 ns, respectively and by varying the amplitude of the voltage pulse from 0.2 Volts to 4.0 Volts. Comparing FIGS. 4 to 8 shows that the resistance margin increases from FIG. 4 to FIG. 8 with the duration of the DC pulse. Thus, in FIG. 8, the highest resistance margin of FIGS. 4 to 8 is shown.

Figure 9:
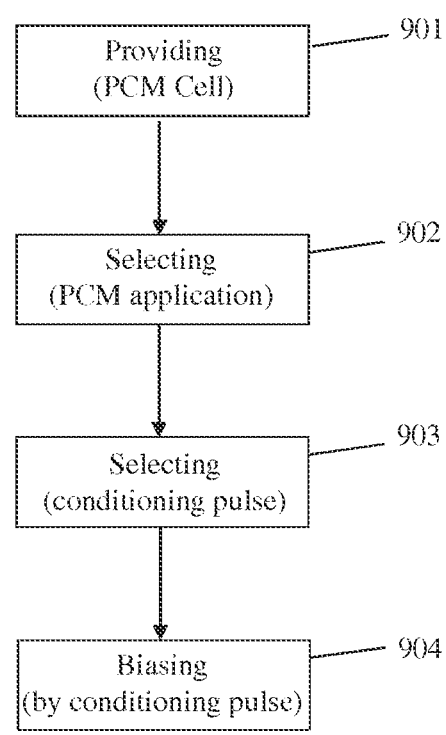
FIG. 9 shows a second embodiment of a sequence of method steps for conditioning a PCM cell.

In FIG. 9, a second embodiment of a sequence of method steps for conditioning a PCM cell is depicted. In step 901, a PCM cell having a number of pre-defined characteristics, as exemplarily explained with reference to FIG. 2, is provided.

In step 902, a certain behaviour or application of a plurality of applications for the PCM cell is selected. One application can be a hybrid-memory application, where speed and endurance are critical, and another application can be a storage application, where high MLC capacity is crucial.

In step 903, at least one conditioning pulse for changing the selected at least one characteristic of a set of pre-defined characteristics of the PCM cell to a desired value in accordance with the selected application is selected.

In step 904, at least one conditioning pulse is applied to the PCM cell such that the selected at least one characteristic is changed to the desired value.

Moreover, the method for FIG. 9 can include a step of selecting a certain application of a plurality of applications for the PCM cell, selecting two of the pre-defined characteristics and fixing them and changing a non-fixed third pre-defined characteristic by the at least one conditioning pulse such that the programming behaviour of the PCM cell is made more suitable for the selected application. For example, the three pre-defined characteristics can include a definite programming speed, a definite programming power and a definite R-margin.

Figure 10:
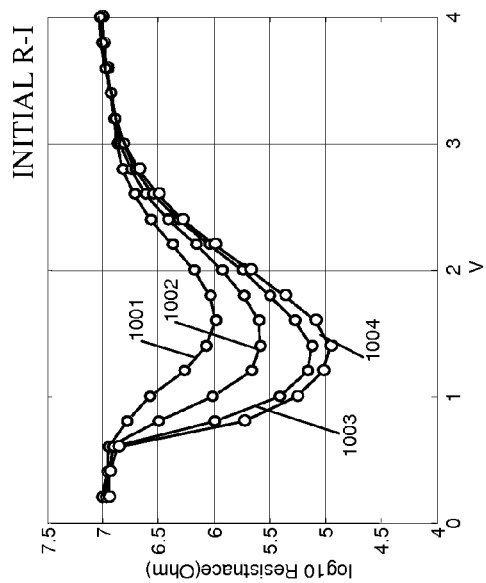
FIG. 10 shows a first example of R-V curves of a PCM cell before conditioning the PCM cell.
Figure 11:
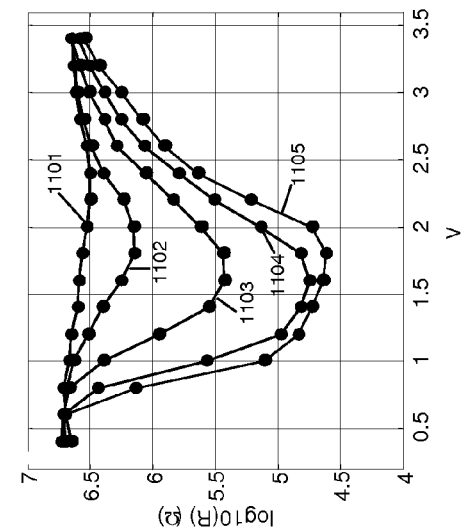
FIG. 11 shows the first example of R-V curves after conditioning the PCM cell and for a conditioning pulse of 1.5 V.

FIGS. 10-13 show a first example of R-V curves of a PCM cell before and after conditioning with a conditioning pulse. In this regard, FIG. 10 shows the R-V curves of the PCM cell before conditioning. FIG. 11 shows the R-V curves after conditioning the PCM cell and for a conditioning pulse of 1.5 V.

Figure 12:
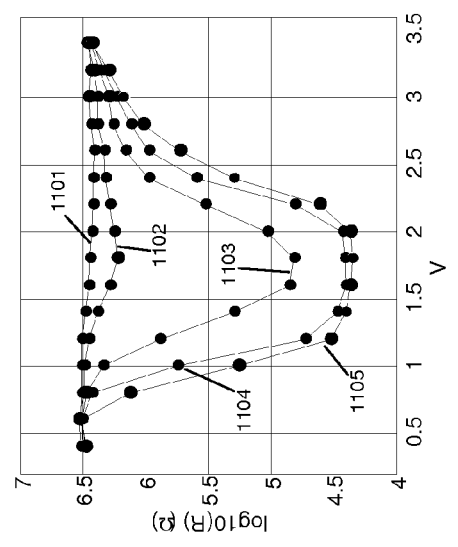
FIG. 12 shows the first example of R-V curves after conditioning the PCM cell and for a conditioning pulse of 2.5 V.
Figure 13:
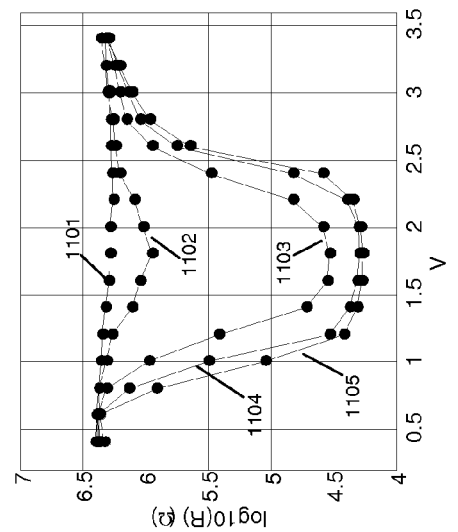
FIG. 13 shows the first example of R-V curves after conditioning the PCM cell and for a conditioning pulse of 3.0 V.

FIG. 12 shows the R-V curves after conditioning the PCM cell and for a conditioning pulse of 2.5 V. Further, FIG. 13 shows the R-V curves after conditioning the PCM cell and for a conditioning pulse of 3.0 V.

In FIG. 10, curve 1001 is generated by pulses with a pulse width of 100 ns, curve 1002 by pulses with pulse width of 200 ns, curve 1003 by pulses with pulse width of 500 ns and curve 1004 by pulses with pulse width of 1000 ns. Further, in FIGS. 11-13, curves 1101, 1102, 1103, 1104 and 1105 are generated by pulses with pulse width of 30 ns, 50 ns, 100 ns, 200 ns and 400 ns, respectively.

Figure 14:
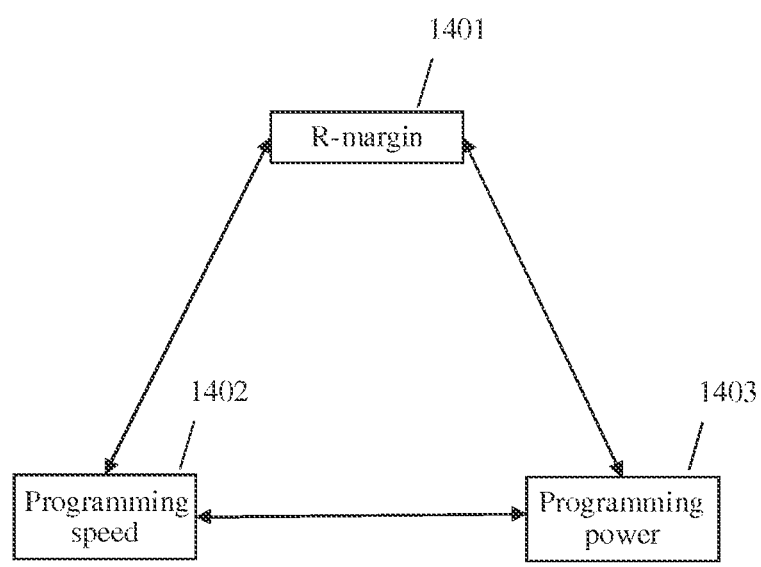
FIG. 14 shows an exemplary diagram illustrating a trade-off triangle of resistance margin, programming speed, and programming power.

FIG. 14 shows an exemplary diagram illustrating a trade-off "triangle" of resistance margin 1401, programming speed 1402 and programming power 1403. For example, two of these predefined characteristics, for example the resistance margin 1401 and the programming speed 1402, can be selected and fixed. The non-fixed third predefined characteristic, here the programming power 1403, can be changed by at least one conditioning pulse.

Three corresponding examples for such a method are depicted in FIGS. 15-18, FIGS. 19-22, and FIGS. 23-26.

In the example of FIGS. 15-18, the programming speed and the programming power are fixed, whereas the R-margin of the PCM cell is changed by the conditioning pulse.

Figure 15:
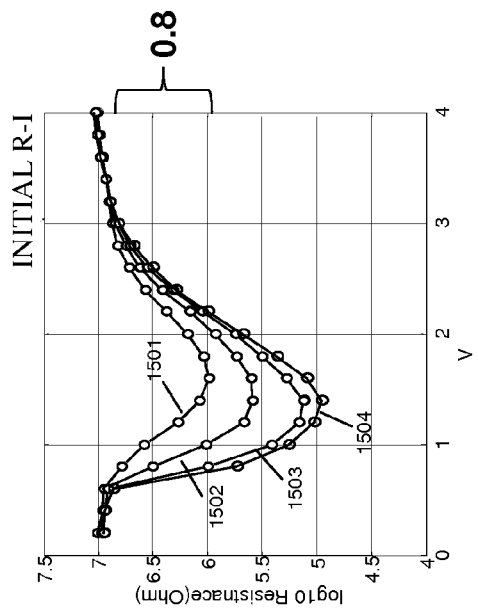
FIG. 15 shows a second example of R-V curves of a PCM cell before conditioning the PCM cell.

In FIG. 15, curves 1501, 1502, 1503 and 1504 are generated by pulses with pulse width of 100 ns, 200 ns, 500 ns and 1000 ns, respectively. Further, in FIGS. 16-18, curves 1601, 1602, 1603, 1604 and 1605 are generated by pulses with pulse width of 30 ns, 50 ns, 100 ns, 200 ns and 400 ns, respectively.

Figure 16:
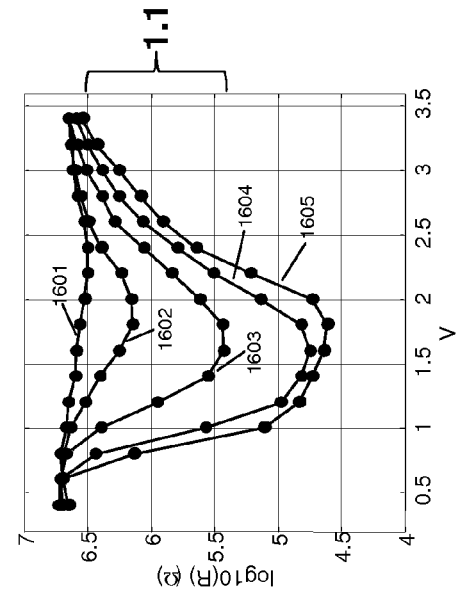
FIG. 16 shows the second example of R-V curves after conditioning the PCM cell and for a conditioning pulse of 1.5 V.
Figure 17:
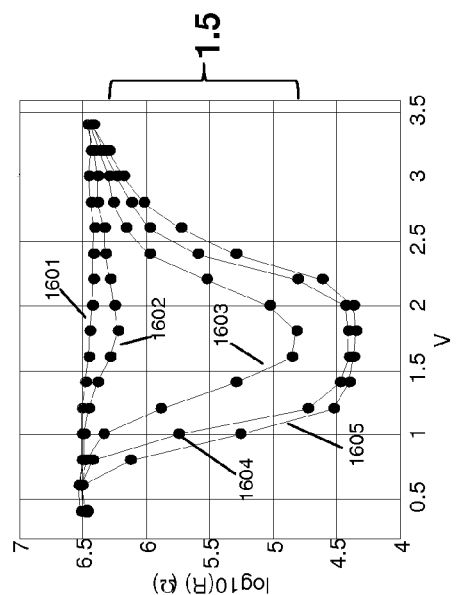
FIG. 17 shows the second example of R-V curves after conditioning the PCM cell and for a conditioning pulse of 2.5 V.
Figure 18:
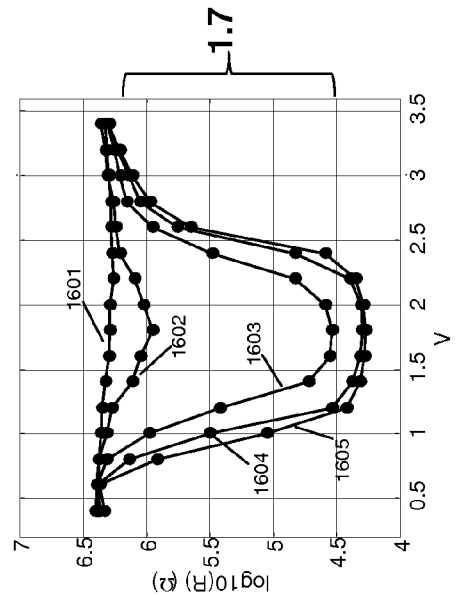
FIG. 18 shows the second example of R-V curves after conditioning the PCM cell and for a conditioning pulse of 3.0 V.

With reference to FIG. 15 and for the example of a pulse width of 100 ns (see curve 1501), the R-margin is 0.8 in the log-resistance scale before conditioning the PCM cell, where the R-margin is defined as the difference between the lowest resistance and the resistance obtained at a fixed programming voltage, in this case equal to 3.0 Volts. With reference to FIG. 16 and curve 1603, this also corresponds to 100 ns pulse width, the R-margin increases to 1.1 after conditioning, and for conditioning pulse of 1.5 V. The R-margin further increases by increasing the conditioning pulse to 2.5 V (see FIGS. 17) and 3.0 V (see FIGS. 18) to 1.5 and 1.7, respectively.

Recapitulating FIGS. 15-18, the R-margin drastically increases at the same programming power and programming speed. Thus, the PCM cell can either accommodate more levels, or have a higher noise margin and thus tolerate more drift, and can have a small R-SET, resulting in less drift and fast read-out. In particular, comparing FIGS. 15 and 18, the R-margin improvement is by a factor of $10^{1.7-0.8}=7.94$.

In the example of FIGS. 19-22, the R-margin and the programming speed are fixed, whereas the programming power is changed by the conditioning pulse.

Figure 19:
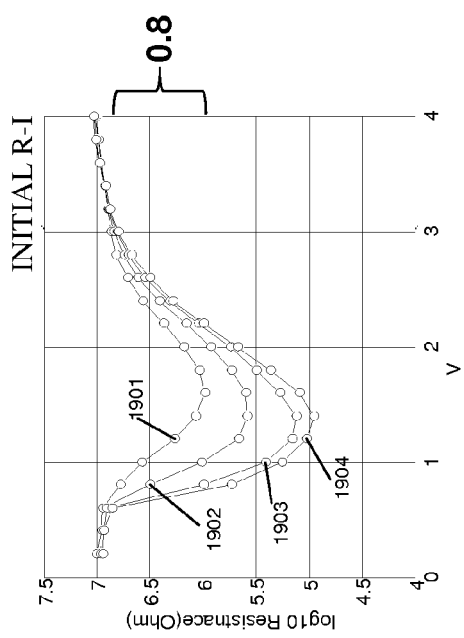
FIG. 19 shows a third example of R-V curves of a PCM cell before conditioning the PCM cell.

In this regard, in FIG. 19, curves 1901, 1902, 1903 and 1904 are generated by pulses with a pulse width of 100 ns, 200 ns, 500 ns and 1000 ns, respectively. Further, in FIGS.

20-22, curves 2001, 2002, 2003, 2004 and 2005 are generated by pulses with pulse width of 30 ns, 50 ns, 100 ns, 200 ns and 400 ns, respectively.

Figure 20:
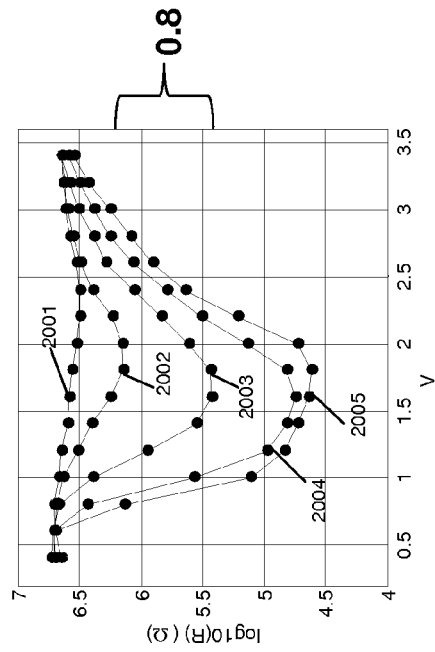
FIG. 20 shows the third example of R-V curves after conditioning the PCM cell and for a conditioning pulse of 1.5 V.
Figure 22:
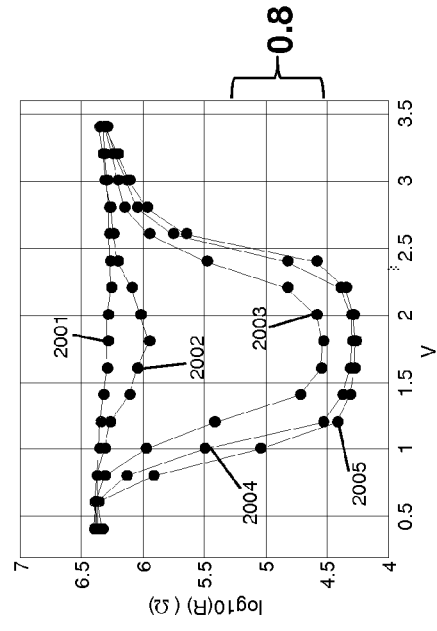
FIG. 22 shows the third example of R-V curves after conditioning the PCM cell and for a conditioning pulse of 3.0 V.
Figure 21:
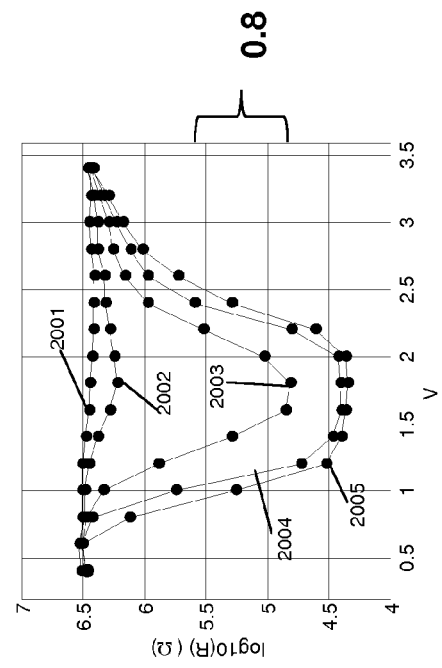
FIG. 21 shows the third example of R-V curves after conditioning the PCM cell and for a conditioning pulse of 2.5 V.

For the example of a programming pulse width of 100 ns and an R-margin of 0.8, FIG. 19 shows a programming power corresponding to 3.0 V, FIG. 20 a programming power corresponding to 2.5 V, FIG. 21 a programming power corresponding to 2.2 V and FIG. 22 a programming power corresponding to 2.3 V.

Recapitulating FIGS. 19-22, the programming power drastically decreases at the same programming speed and R-margin. This results in a low energy/per bit and high endurance. Moreover, the shift of the R-margin to lower resistances results in high-speed read and less drift.

In the example of FIG. 23-26, the R-margin and the programming power are fixed, whereas the programming speed of the PCM cell is changed by the conditioning pulse.

Figure 23:
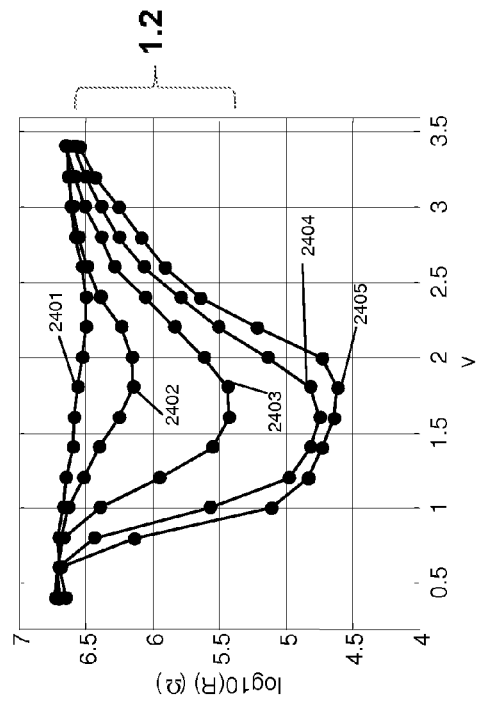
FIG. 23 shows a fourth example of R-V curves of a PCM cell before conditioning the PCM cell.

In FIG. 23, curves 2301, 2302, 2303 and 2304 are generated by pulses with pulse width of 100 ns, 200 ns, 500 ns and 1000 ns, respectively. Further, in FIGS. 24-26, curves 2401, 2402, 2403, 2404 and 2405 are generated by pulses with pulse width of 30 ns, 50 ns, 100 ns, 200 ns and 400 ns, respectively.

Figure 24:
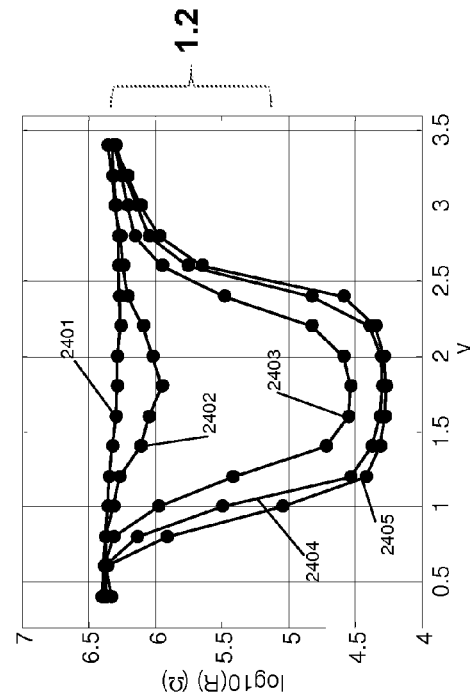
FIG. 24 shows the fourth example of R-V curves after conditioning the PCM cell and for a conditioning pulse of 1.5 V.
Figure 25:
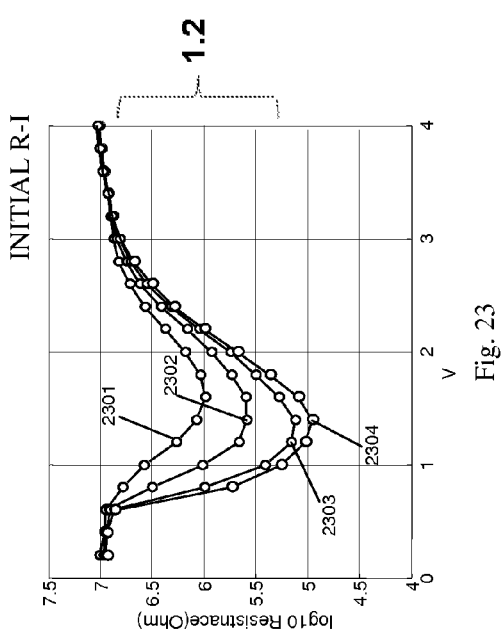
FIG. 25 shows the fourth example of R-V curves after conditioning the PCM cell and for a conditioning pulse of 2.5 V.
Figure 26:
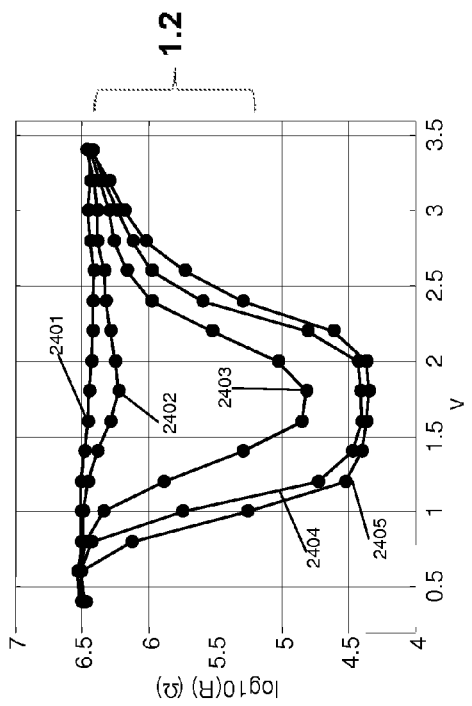
FIG. 26 shows the fourth example of R-V curves after conditioning the PCM cell and for a conditioning pulse of 3.0 V.

For the example of an R-margin of 1.2 and a programming power corresponding to 3.0V, FIG. 23 shows a necessary programming pulse width of 200 ns (see curve 2302), FIG. 24 a necessary programming pulse width of 100 ns (see curve 2403), FIG. 25 a necessary programming pulse width of less than 100 ns (see curve 2403) and FIG. 26 also a necessary programming pulse width of less than 100 ns (see curve 2403).

The cell conditioning can result in a drastic reduction of the programming latency at the same R-margin and programming power. Therefore, high performance applications, in particular memory applications, can be possible.

Figure 27:
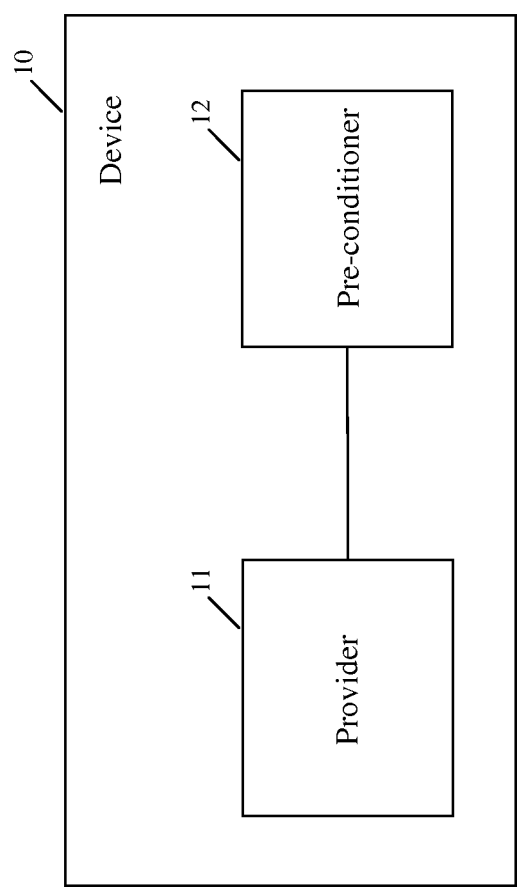
FIG. 27 shows a block diagram of an embodiment of a device for conditioning a PCM cell.

FIG. 27 shows a block diagram of an embodiment of a device 10 for conditioning a PCM cell. The device 10 comprises a provider 11 and a pre-conditioner 12. The provider 11 is configured to provide or manufacture a PCM cell having a number of pre-defined characteristics. In particular, the provider provides an array of a plurality of PCM cells.

The pre-conditioner 12 is configured to bias a PCM cell by at least one conditioning pulse such that at least one selected characteristic of the number of pre-defined characteristics is changed. The pre-conditioner 12 can be adapted to bias the PCM cells of a selected subset of the array of PCM cells.

Computerized devices can be suitably designed for implementing embodiments of the present invention as described herein. It can be appreciated that the methods described herein are largely non-interactive and automated. In exemplary embodiments, the methods described herein can be implemented either in an interactive, partly-interactive or non-interactive system. The methods described herein can be implemented in software (e.g., firmware), hardware, or a combination thereof. In exemplary embodiments, the methods described herein are implemented in software, as an executable program, the latter executed by suitable digital processing devices. In further exemplary embodiments, at least one step or all steps of above method for FIG. 2 or 9 can be implemented in software, as an executable program, the latter executed by suitable digital processing devices. More generally, embodiments of the present invention can be implemented wherein general-purpose digital computers, such as personal computers, workstations, etc., are used.

Figure 28:
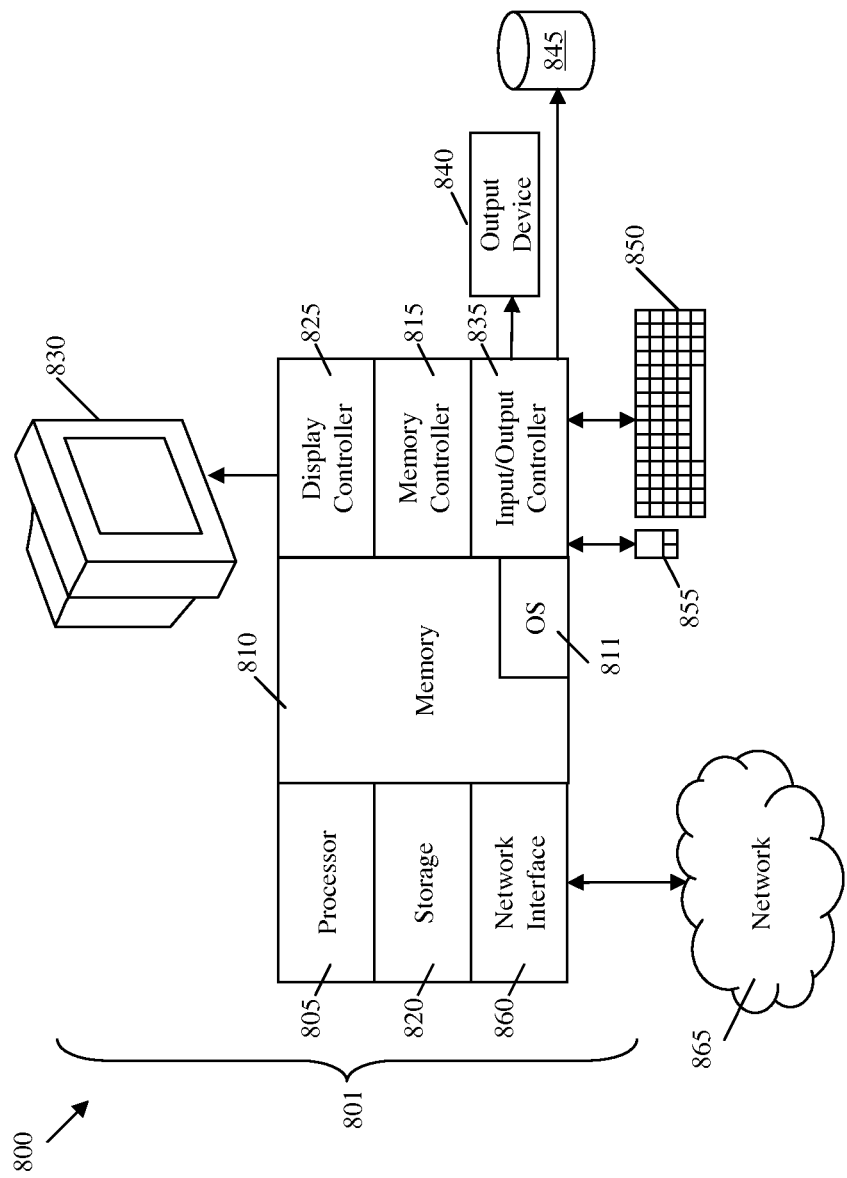
FIG. 28 shows a schematic block diagram of an embodiment of a system adapted for performing the method for conditioning a PCM cell.

The system 800 depicted in FIG. 28 schematically represents a computerized unit 801, e.g., a general-purpose computer. For example, the system 800 can embody a device 10 as shown in FIG. 27. In exemplary embodiments, in terms of hardware architecture, as shown in FIG. 28, the unit 801 includes a processor 805, memory 810 coupled to a memory controller 815, and one or more input and/or output (I/O) devices 840, 845, 850, 855 (or peripherals) that are communicatively coupled via a local input/output controller 835. The input/output controller 835 can be, but is not limited to, one or more buses or other wired or wireless connections, as is known in the art. The input/output controller 835 can have additional elements, which are omitted for simplicity, such as controllers, buffers (caches), drivers, repeaters, and receivers, to enable communications. Further, the local interface can include address, control, and/or data connections to enable appropriate communications among the aforementioned components.

The processor 805 is a hardware device for executing software, particularly that stored in memory 810. The processor 805 can be any custom made or commercially available processor, a central processing unit (CPU), an auxiliary processor among several processors associated with the computer 801, a semiconductor based microprocessor (in the form of a microchip or chip set), or generally any device for executing software instructions.

The memory 810 can include any one or combination of volatile memory elements (e.g., random access memory) and nonvolatile memory elements. The memory 810 can incorporate electronic, magnetic, optical, and/or other types of storage media. Note that the memory 810 can have a distributed architecture, where various components are situated remote from one another, but can be accessed by the processor 805.

The software in memory 810 can include one or more separate programs, each of which comprises an ordered listing of executable instructions for implementing logical functions. In the example of FIG. 28, the software in the memory 810 includes methods described herein in accordance with exemplary embodiments and a suitable operating system (OS) 811. The OS 811 essentially controls the execution of other computer programs, such as the methods as described herein (e.g., FIG. 2 or 9), and provides scheduling, input-output control, file and data management, memory management, and communication control and related services.

The methods described can be in the form of a source program, executable program (object code), script, or any other entity comprising a set of instructions to be performed. When in a source program form, then the program needs to be translated via a compiler, assembler, interpreter, or the like, as known per se, which can or cannot be included within the memory 810, so as to operate properly in connection with the OS 811. The methods can be written as an object oriented programming language, which has classes of data and methods, or a procedure programming language, which has routines, subroutines, and/or functions.

A conventional keyboard 850 and mouse 855 can be coupled to the input/output controller 835. Other I/O devices 840-855 can include sensors (especially in the case of network elements), i.e., hardware devices that produce a measurable response to a change in a physical condition like temperature or pressure (physical data to be monitored). The analog signal produced by the sensors is digitized by an analog-to-digital converter and sent to controllers 835 for further processing. Sensor nodes are ideally small, consume low energy, are autonomous and operate unattended.

the I/O devices 840-855 can further include devices that communicate both inputs and outputs. The system 800 can further include a display controller 825 coupled to a display 830. In exemplary embodiments, the system 800 can further include a network interface or transceiver 860 for coupling to a network 865.

The network 865 transmits and receives data between the unit 801 and external systems. The network 865 is possibly implemented in a wireless fashion, e.g., using wireless protocols and technologies, such as IEEE 802.15.4 or similar. The network 865 can be a fixed wireless network, a wireless local area network (LAN), a wireless wide area network (WAN) a personal area network (PAN), a virtual private network (VPN), intranet or other suitable network system and includes equipment for receiving and transmitting signals.

When the unit 801 is in operation, the processor 805 is configured to execute software stored within the memory 810, to communicate data to and from the memory 810, and to generally control operations of the computer 801 pursuant to the software. The methods described herein and the OS 811, in whole or in part are read by the processor 805, typically buffered within the processor 805, and then executed. When the methods described herein (e.g. with reference to FIG. 2 or 9) are implemented in software, the methods can be stored on any computer readable medium, such as storage 820, for use by or in connection with any computer related system or method.

As will be appreciated by one skilled in the art, aspects of the present invention can be embodied as a system, method or computer program product. Accordingly, aspects of the present invention can take the form of an entirely hardware embodiment, an entirely software embodiment (including firmware, resident software, micro-code, etc.) or an embodiment combining software and hardware aspects. Furthermore, aspects of the present invention can take the form of a computer program product embodied in one or more computer readable medium(s) having computer readable program code embodied thereon. Any combination of one or more computer readable medium(s) can be utilized. The computer readable medium can be a computer readable signal medium or a computer readable storage medium.

A computer readable storage medium can be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium can include the following: an electrical connection having one or more wires, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium can be any tangible medium that can contain, or store a program for use by or in connection with an instruction execution system, apparatus, or device.

A computer readable signal medium can include a propagated data signal with computer readable program code embodied therein, for example, in baseband or as part of a carrier wave. Such a propagated signal can take any of a variety of forms, including, but not limited to, electromagnetic, optical, or any suitable combination thereof. A computer readable signal medium can be any computer readable medium that is not a computer readable storage medium and that can communicate, propagate, or transport a program for use by or in connection with an instruction execution system, apparatus, or device. Program code embodied on a computer readable medium can be transmitted using any appropriate medium, including but not limited to wireless, wireline, optical fiber cable, RF, etc., or any suitable combination of the foregoing.

Computer program code for carrying out operations for aspects of the present invention can be written in any combination of one or more programming languages, including an object oriented programming language such as Java, Smalltalk, C++ or the like and conventional procedural programming languages, such as the "C" programming language or similar programming languages. The program code can execute entirely on the unit 801, partly thereon, partly on a unit 801 and another unit 801, similar or not.

Aspects of the present invention are described above with reference to flowchart illustrations and/or block diagrams of methods, apparatus (systems) and computer program products according to embodiments of the invention. It will be understood that each block of the flowchart illustrations and/or block diagrams can be implemented by one or more computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions can also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams can represent a module, segment, or portion of code, which comprises one or more executable instructions for implementing the specified logical function (s). It should also be noted that, in some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved and algorithm optimization. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the present invention has been described with reference to certain embodiments, it will be understood by those skilled in the art that various changes can be made and equivalents can be substituted without departing from the scope of the present invention. In addition, many modifications can be made to adapt a particular situation to the teachings of the present invention without departing from its scope. Therefore, it is intended that the present invention not be limited to the particular embodiments disclosed, but that the present invention will include all embodiments falling within the scope of the appended claims.

We claim:

1. A method for conditioning at least one Phase Change Memory (PCM) cell having a number of pre-defined characteristics, the method comprising:
   selecting a desired behavior from a set of pre-determined behaviours, wherein the set of pre-determined behaviours includes DRAM (Dynamic Random Access Memory) behaviour, including fast read/write and high reliability, and multi-level cell storage behaviour, including low cost per bit;
   selecting at least one characteristic which is to be changed from the number of pre-defined characteristics, wherein the number of pre-defined characteristics includes a certain resistance margin between a lowest and a highest resistance value of the PCM cell, a certain programming speed being defined as a duration of the programming pulse necessary to bring the PCM cell to a definite low-resistance state, and a certain programming power being defined as the power of the programming pulse necessary to bring the cell to a definite high-resistance state;
   selecting at least one conditioning pulse for changing the selected characteristic to a desired value for the desired behaviour; and
   applying the selected conditioning pulse to the PCM cell such that the selected characteristic is changed to the desired value.

2. The method of claim 1, further comprising:
   selecting two of the pre-defined characteristics and holding them unchanged; and
   changing the other third pre-defined characteristic by the selected conditioning pulse.

3. The method of claim 1, further comprising:
   selecting one of the pre-defined characteristics and holding it unchanged; and
   changing the other two pre-defined characteristics to desired values by the selected conditioning pulse.

4. The method of claim 1, wherein the conditioning pulse is embodied by a single long pulse or by a sequence of short pulses, wherein each of the short pulses is a box pulse.

5. The method of claim 1, wherein the conditioning pulse is applied once to the PCM cell before the PCM cell is used in a certain application of a plurality of applications for the PCM cell.

6. The method of claim 1, wherein the PCM cell is controllable by a first terminal connected to a bitline and by a second terminal connected to a wordline, and wherein the conditioning pulse is a pulse applied to the wordline and the second terminal.

7. The method of claim 1, wherein a shape of the conditioning pulse is adapted in dependence on the desired value of the at least one selected characteristic of the PCM cell.

8. The method of claim 1, further comprising:
   selecting a subset of an array of PCM cells; and
   applying at least one conditioning pulse to the PCM cells of the selected subset such that at least one selected characteristic of the number of predefined characteristics is changed.

9. The method of claim 8, further comprising:
   identifying those PCM cells in the array for which the pre-defined characteristics do not have the desired values; and
   applying at least one conditioning pulse to the identified PCM cells such that the characteristics of the identified PCM cells obtain the desired values.

10. The method of claim 1, wherein the duration of the conditioning pulse is at least $10^5$ times longer than the RESET programming pulse for programming the PCM cell to have the highest (RESET) resistance value, wherein the duration of the RESET programming pulse is less than 100 ns.

11. The method of claim 1, wherein:
    the desired behaviour is DRAM behaviour;
    the selected characteristic is the certain programming speed; and
    the desired value of the certain programming speed is higher than a present value of the certain programming speed.

12. The method of claim 1, wherein:
    the desired behaviour is multi-level cell storage behaviour;
    the selected characteristic is the certain programming power; and
    the desired value of the certain programming power is lower than a present value of the certain programming power.

13. The method of claim 1, wherein the PCM cell is controllable by a single terminal, and wherein the conditioning pulse is a pulse applied to the single terminal.

* * * * *